(12) United States Patent
Okada

(10) Patent No.: US 11,277,116 B2
(45) Date of Patent: Mar. 15, 2022

(54) MULTIPLEXER

(71) Applicant: Murata Manufacturing Co., Ltd., Nagaokakyo (JP)

(72) Inventor: Keiji Okada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/903,495

(22) Filed: Jun. 17, 2020

(65) Prior Publication Data

US 2021/0021256 A1   Jan. 21, 2021

(30) Foreign Application Priority Data

Jul. 16, 2019   (JP) .............................. JP2019-130856

(51) Int. Cl.
| | | |
|---|---|---|
| H03H 9/46 | (2006.01) | |
| H03H 9/54 | (2006.01) | |
| H03H 9/60 | (2006.01) | |
| H03H 9/13 | (2006.01) | |
| H03H 9/70 | (2006.01) | |

(52) U.S. Cl.
CPC .............. H03H 9/605 (2013.01); H03H 9/13 (2013.01); H03H 9/46 (2013.01); H03H 9/542 (2013.01); H03H 9/70 (2013.01)

(58) Field of Classification Search
CPC .......... H03H 9/605; H03H 9/13; H03H 9/542; H03H 9/70
See application file for complete search history.

(56) References Cited

U.S. PATENT DOCUMENTS

| | | | | |
|---|---|---|---|---|
| 9,219,467 | B2* | 12/2015 | Inoue ..................... | H03H 9/725 |
| 9,882,548 | B2* | 1/2018 | Takamine .............. | H03H 9/562 |
| 2010/0150075 | A1 | 6/2010 | Inoue et al. | |
| 2016/0173062 | A1* | 6/2016 | Takamine ............ | H03H 9/6479 333/133 |
| 2018/0131349 | A1 | 5/2018 | Takata | |

FOREIGN PATENT DOCUMENTS

| | | |
|---|---|---|
| JP | 2018-074539 A | 5/2018 |
| WO | 2009/025106 A1 | 2/2009 |

* cited by examiner

*Primary Examiner* — Dinh T Le
(74) *Attorney, Agent, or Firm* — Keating & Bennett, LLP

(57) ABSTRACT

A multiplexer includes a transmit filter circuit, a receive filter circuit, and an additional circuit connected in parallel with a portion of the transmit filter circuit. The transmit filter circuit includes series resonators on a signal path connecting a common terminal and a first terminal, and parallel resonators on the signal path between a node and ground. The series resonator closest to the first terminal includes split resonators. The additional circuit includes a capacitor and a resonator group. The resonator group includes IDT electrodes side by side in the direction of acoustic wave propagation. A first end of the resonator group is connected to the common terminal with the capacitor interposed therebetween. A second end of the resonator group is connected to the signal path between two of the split resonators such that no capacitor is interposed between the second end and the signal path.

16 Claims, 5 Drawing Sheets

IMPEDANCE OF MULTIPLEXER IN TRANSMIT FREQUENCY BAND AS SEEN FROM TERMINAL P1

BANDPASS CHARACTERISTICS BETWEEN TERMINALS P1 AND P0

MULTIPLEXER

CROSS REFERENCE TO RELATED APPLICATIONS

This application claims the benefit of priority to Japanese Patent Application No. 2019-130856 filed on Jul. 16, 2019. The entire contents of this application are hereby incorporated herein by reference.

BACKGROUND OF THE INVENTION

1. Field of the Invention

The present invention relates to a multiplexer including an additional circuit.

2. Description of the Related Art

Multiplexers including a cancellation circuit as an additional circuit are known in the art (e.g., Japanese Unexamined Patent Application Publication No. 2018-74539).

FIG. 9 is a circuit diagram illustrating an example of the configuration of a multiplexer described in Japanese Unexamined Patent Application Publication No. 2018-74539. As illustrated in FIG. 9, a multiplexer 7 includes a transmit filter circuit 60, a receive filter circuit 70, and a cancellation circuit 80.

The transmit filter circuit 60 and the receive filter circuit 70 are connected by a common terminal P0. The multiplexer 7 thus functions as a duplexer that receives a radio frequency signal at a terminal P1 and outputs the received signal from the terminal P0 via the transmit filter circuit 60, and also receives a radio frequency signal at the terminal P0 and outputs the received signal from a terminal P2 via the receive filter circuit 70.

The transmit filter circuit 60 is a filter whose transmit frequency band defines the pass band. The transmit filter circuit includes a ladder resonator filter that includes series resonators 61, 62, 63, and 64 and parallel resonators 65, 66, 67, and 68. Inductors 91 and 92 for adjusting characteristics are respectively connected between the parallel resonator 65 and ground, and between the parallel resonators 66 and 67 and ground. The series resonators 62, 63, and 64 are split resonators.

The receive filter circuit 70 is a filter whose receive frequency band defines the pass band. The receive filter circuit 70 includes a ladder resonator filter, and a longitudinally coupled resonator filter 75. The ladder resonator filter includes series resonators 71 and 72, and parallel resonators 73 and 74. The longitudinally coupled resonator filter 75 includes longitudinally coupled resonators 76 and 77 connected in parallel with each other.

The cancellation circuit 80 includes a longitudinally coupled resonator 81, and a capacitor 82. The cancellation circuit 80 is connected in parallel with a portion of the transmit filter circuit 60. More specifically, one end of the longitudinally coupled resonator 81 is connected to the terminal P0 with the capacitor 82 interposed therebetween, and the other end of the longitudinally coupled resonator 81 is connected to the signal path between the series resonators 61 and 62 of the transmit filter circuit 60 with no capacitor interposed between the other end and the signal path. The capacitor 82 is formed as a resonator.

The cancellation circuit 80 generates a cancellation signal that is opposite in phase and equal in amplitude to an undesired signal, which is a signal in an undesired frequency band (e.g., receive frequency band) passing through the transmit filter circuit 60. In the combined circuit of the transmit filter circuit 60 and the cancellation circuit 80, the undesired signal and the cancellation signal are summed to cause the amplitude of the undesired signal to decrease. This improves characteristics including attenuation in the transmit path and isolation between the transmitting and receiving sides (to be collectively referred to as electrical characteristics).

With the multiplexer 7, the combined impedance of the transmit filter circuit 60 and the cancellation circuit 80 as seen from the terminal P1 can be adjusted by the series resonator 61 of the transmit filter circuit 60. This eliminates the need to provide a capacitor at a location in the longitudinally coupled resonator 81 near the terminal P1. Therefore, improved electrical characteristics can be obtained by the multiplexer 7 with reduced size.

Existing multiplexers are easy to miniaturize but often are difficult to improve in terms of electrical characteristics.

SUMMARY OF THE INVENTION

Accordingly, preferred embodiments of the present invention provide multiplexers that each include an additional circuit, and that each achieve both reduced size and improved electrical characteristics.

A multiplexer according to a preferred embodiment of the present invention includes a first filter circuit connected to a common terminal and to a first terminal, a second filter circuit connected to the common terminal and to a second terminal, and an additional circuit connected in parallel with a portion of the first filter circuit. The first filter circuit includes at least one series resonator on a signal path connecting the common terminal and the first terminal, and at least one parallel resonator between ground and the corresponding one of a plurality of nodes on the signal path. A series resonator of the at least one series resonator that is closest to the first terminal includes a plurality of split resonators connected in series such that no nodes are interposed between the split resonators. The additional circuit includes a resonator group including a plurality of interdigital transducer (IDT) electrodes, and a capacitor. The IDT electrodes are positioned side by side over a piezoelectric substrate in a direction of acoustic wave propagation. A first end of the resonator group is connected to the common terminal with the capacitor interposed between the first end and the common terminal. A second end of the resonator group is connected to the signal path between adjacent ones of the split resonators such that no capacitor is interposed between the second end and the signal path.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be described in detail below with reference to preferred embodiments of the present invention and the drawings. The preferred embodiments described below each represent a generic or specific example. Features presented in the following preferred embodiments, such as numerical values, shapes, materials, components, and the placement and connection of components, are illustrative only and not intended to limit the present invention. As used in the following description of the preferred embodiments, the term "connected" includes various structures and connections including circuit elements that are directly connected by a wiring conductor or circuit elements that are electrically connected with another circuit element interposed therebetween.

A multiplexer according to a preferred embodiment of the present invention will be described below with reference to, by way of example, a duplexer including a transmit filter circuit, a receive filter circuit, and an additional circuit connected in parallel with a portion of the transmit filter circuit.

Figure 1:
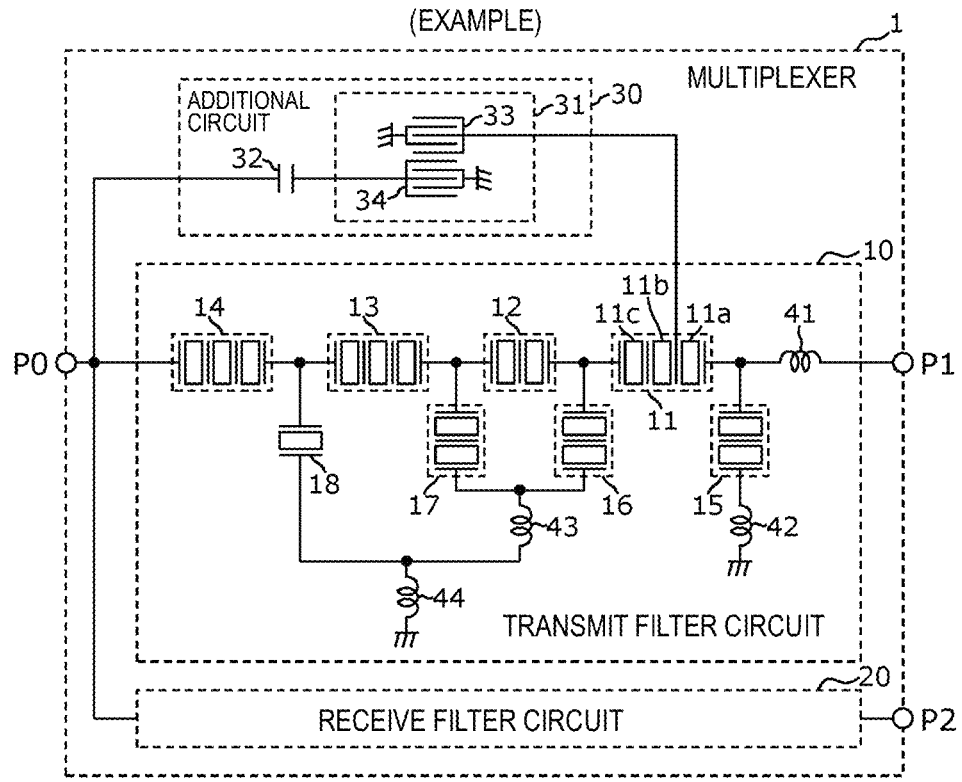
FIG. 1 is a circuit diagram illustrating an example of a multiplexer according to a preferred embodiment of the present invention.

FIG. 1 is a circuit diagram illustrating an example of a multiplexer according to a preferred embodiment of the present invention. As illustrated in FIG. 1, a multiplexer 1 includes terminals P0, P1, and P2, a transmit filter circuit 10, a receive filter circuit 20, and an additional circuit 30. The terminal P0 is connected to, for example, an antenna (not illustrated).

The terminal P0, the terminal P1, and the terminal P2 respectively represent an example of a common terminal, an example of a first terminal, and an example of a second terminal. The transmit filter circuit 10 and the receive filter circuit 20 respectively represent an example of a first filter circuit, and an example of a second filter circuit.

The transmit filter circuit 10 has a predetermined transmit frequency band as its pass band. The transmit filter circuit 10 is connected to the terminal P0 and to the terminal P1. One end of the transmit filter circuit 10 and the other end of the transmit filter circuit 10 may be respectively connected to the terminal P0 and the terminal P1, either directly or with another circuit element (not illustrated) interposed between each end and the corresponding terminal.

The transmit filter circuit 10 includes, for example, a ladder resonator filter including series resonators 11 to 14, parallel resonators 15 to 18, and inductors 41 to 44.

The series resonators 11 to 14 are disposed on a series arm, which is a signal path connecting the terminal P0 and the terminal P1. The parallel resonators 15 to 18 are each disposed on a parallel arm, which is a signal path connecting the corresponding node on the series arm to ground. The inductor 41 is disposed on the series arm between the series resonator 11 and the terminal P1, and the inductors 43 and 44 are each disposed on the parallel arm.

The series resonator 11, which is the series resonator closest to the terminal P1, includes a plurality of split resonators 11a, 11b, and 11c connected in series such that none of the nodes connected with the parallel resonators 15 to 18 is interposed between the split resonators. Similarly, the series resonators 12 to 14, and the parallel resonators 15 to 17 may each include a plurality of split resonators connected in series such that no node connected with another resonator is interposed between these split resonators.

The receive filter circuit 20 has a predetermined receive frequency band as its pass band. The receive filter circuit 20 is connected to the terminal P0 and to the terminal P2. One end of the receive filter circuit 20 and the other end of the receive filter circuit 20 may be respectively connected to the terminal P0 and the terminal P2, either directly or with another circuit element (not illustrated) interposed between each end and the corresponding terminal.

Figure 9:
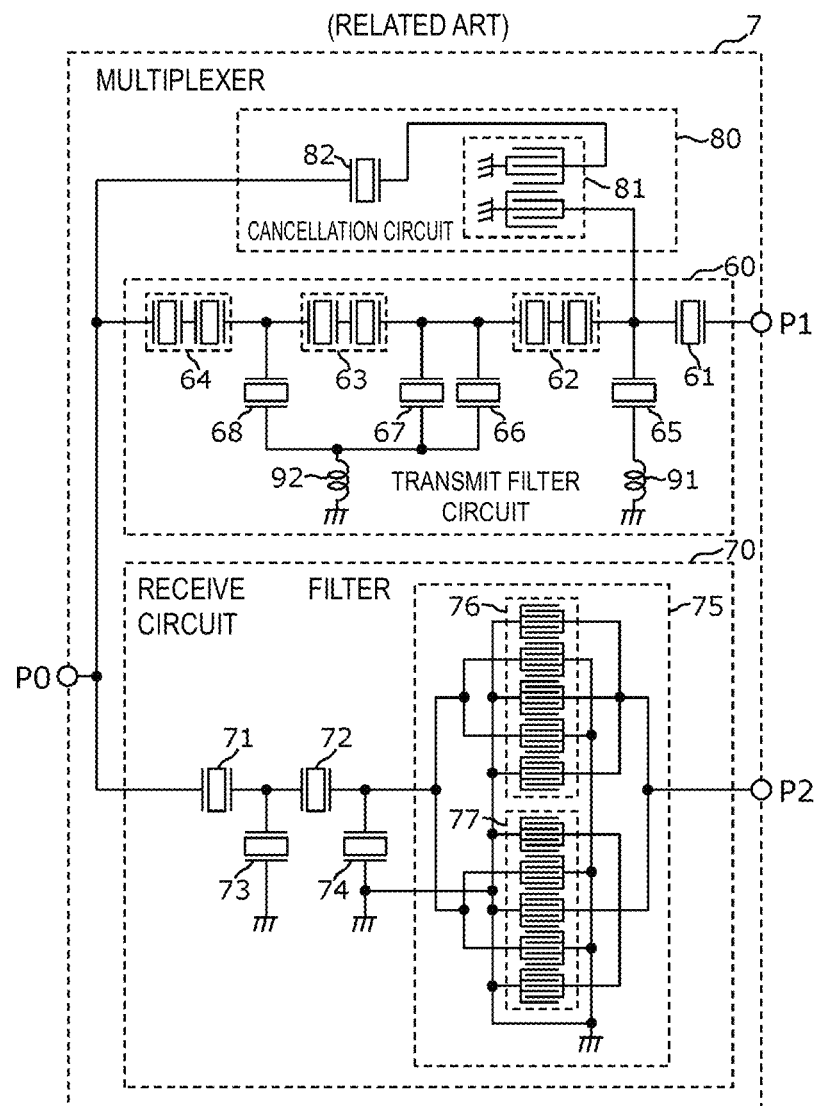
FIG. 9 is a circuit diagram illustrating an example of a multiplexer according to the related art.

The configuration of the receive filter circuit 20 is not particularly limited. In one example, the receive filter circuit 20 may have the same or substantially the same configuration as the receive filter circuit 70 illustrated in FIG. 9. In other words, the receive filter circuit 20 may include, for example, a ladder filter circuit, and a longitudinally coupled resonator filter circuit (not illustrated).

The additional circuit 30 includes a resonator group 31, and a capacitor 32. The resonator group 31 includes IDT electrodes 33 and 34 disposed side by side in the direction of acoustic wave propagation. The additional circuit 30 is connected in parallel with a portion of the transmit filter circuit 10. More specifically, one end of the resonator group 31 is connected to the terminal P0 with the capacitor 32 interposed therebetween, and the other end of the resonator group 31 is connected to the signal path between the split resonators 11a and 11b with no capacitor interposed between the other end and the signal path.

The resonator group 31 may define a longitudinally coupled resonator filter that uses coupling of surface acoustic waves between IDT electrodes to transmit a signal, or may define a transversal filter that uses propagation of surface acoustic waves between IDT electrodes to transmit a signal. The resonator group 31 may include three or more IDT electrodes (not illustrated).

The resonator group 31 controls the phase of a signal passing through the additional circuit 30. The capacitor 32 controls the amplitude of a signal passing through the additional circuit 30. The additional circuit 30 thus generates a signal (i.e., cancellation signal) to cancel a target signal that leaks from the transmit filter circuit 10 (e.g., a signal component in the receive frequency band).

A cancellation signal is a signal such that, when the cancellation signal is summed with a target signal component, the summed signal has an amplitude less than the amplitude of the target signal component. The cancellation signal is opposite in phase and preferably equal or substantially equal in amplitude to the target signal component.

When it is herein stated that a target signal component and a cancellation signal are in opposite phase, this means that their phase difference is greater than about 90 degrees in absolute value within a range from not less than about −180 degrees to not greater than about 180 degrees. This equates to when the target signal component and the cancellation signal have phase components opposite to each other.

Although the cancellation signal preferably has the same or substantially the same amplitude as the target signal component, the cancellation signal may have a different amplitude from the target signal component. In this regard, if, in accordance with the phase difference between the cancellation signal and the target signal component, the sum of the two signals has an amplitude less than the amplitude of the target signal component, then improved attenuation characteristics can be obtained.

The basic structure of an IDT electrode will be described below.

Figure 2A:
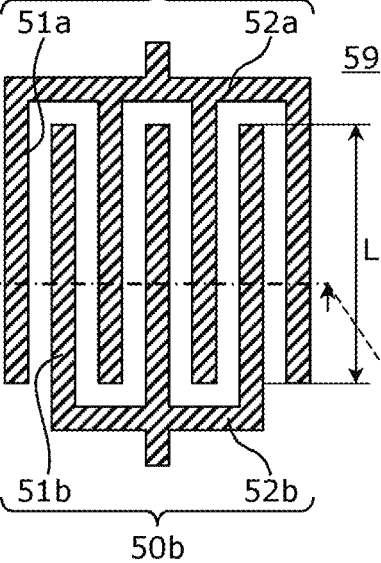
FIGS. 2A and 2B are respectively plan view and cross-sectional views of an IDT electrode, each schematically illustrating an example of the structure of the IDT electrode.
Figure 2B:
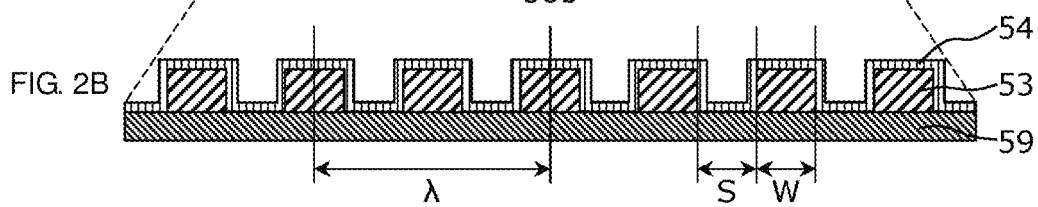

FIGS. 2A and 2B are respectively plan view and cross-sectional views of an IDT electrode 50, each schematically illustrating an example of the structure of the IDT electrode 50. The structure of the IDT electrode 50 illustrated in FIGS. 2A and 2B is used not only for the IDT electrodes 33 and 34 in the additional circuit 30, but also for resonators in the transmit filter circuit 10, including the individual split resonators defining the series resonators 11 to 14 and the parallel resonators 15 to 17, and the parallel resonator 18. The example in FIGS. 2A and 2B is presented to explain the basic structure of the IDT electrode 50, and details such as the number and length of electrode fingers defining the electrode are not limited to those in FIGS. 2A and 2B.

The IDT electrode 50 includes a pair of comb-shaped electrodes 50a and 50b facing each other. The comb-shaped electrode 50a includes a plurality of electrode fingers 51a that are parallel or substantially parallel to each other, and a busbar electrode 52a that connects the electrode fingers 51a. The comb-shaped electrode 50b includes a plurality of electrode fingers 51b that are parallel or substantially parallel to each other, and a busbar electrode 52b that connects the electrode fingers 51b. The electrode fingers 51a and 51b extend in a direction orthogonal or substantially orthogonal to the X-axis direction, which is the direction of acoustic wave propagation. The electrode fingers 51a and 51b are interdigitated.

Parameters that determine the shape and size of the IDT electrode 50 are referred to as electrode parameters. Examples of electrode parameters include a wavelength λ, which is the repetition period of the electrode finger 51a or 51b in the X-axis direction, an intersecting width L, which is the overlapping length of the electrode fingers 51a and 51b as seen in the X-axis direction, a line width W of each of the electrode fingers 51a and 51b, and a spacing S between the electrode finger 51a and the electrode finger 51b that are adjacent to each other.

Other examples of electrode parameters include the number of pairs, which equals one half of the number of electrode fingers 51a and 51b combined, a pitch (W+S), which is the repetition period of the electrode fingers 51a and 51b combined, and a duty ratio W/(W+S), which is the ratio of the line width to the pitch.

The electrode fingers 51a and 51b, and the busbar electrodes 52a and 52b are each defined by an electrode layer 53 disposed over a piezoelectric substrate 59.

In one example, the electrode layer 53 is preferably made of a metal such as copper or aluminum, or an alloy thereof. The piezoelectric substrate 59 is preferably defined by a piezoelectric layer including a material such as lithium tantalate or lithium niobate, for example. The electrode layer 53 may be provided over the piezoelectric substrate 59 with an adhesion layer (not illustrated) interposed therebetween. The electrode layer 53 may be coated with a protective layer.

The piezoelectric substrate 59 may defined by a single piezoelectric layer, or may be defined by a multilayer substrate having piezoelectricity at least in a portion thereof.

The multilayer substrate having piezoelectric properties at least in a portion thereof may be a multilayer body including a support substrate, a high acoustic velocity film, a low acoustic velocity film, and a piezoelectric thin film. The high acoustic velocity film is a film provided over the support substrate and in which a bulk wave propagates at a higher acoustic velocity than an acoustic wave that propagates in the piezoelectric thin film. The low acoustic velocity film is a film stacked over the high acoustic velocity film and in which a bulk wave propagates at a lower acoustic velocity than an acoustic bulk wave that propagates in the piezoelectric thin film. The piezoelectric thin film is stacked over the low acoustic velocity film. The support substrate may be a high acoustic velocity support substrate, such as, for example, a silicon substrate that doubles as a high acoustic velocity film and a support substrate.

The capacitance of the IDT electrode 50, and the surface area of the IDT electrode 50 over the piezoelectric substrate 59 are determined in accordance with electrode parameters.

The following describes advantageous effects of the multiplexer 1 configured as described above in comparison with Comparative Examples. In the following description, the multiplexer 1 will be referred to as "Example".

Figure 3:
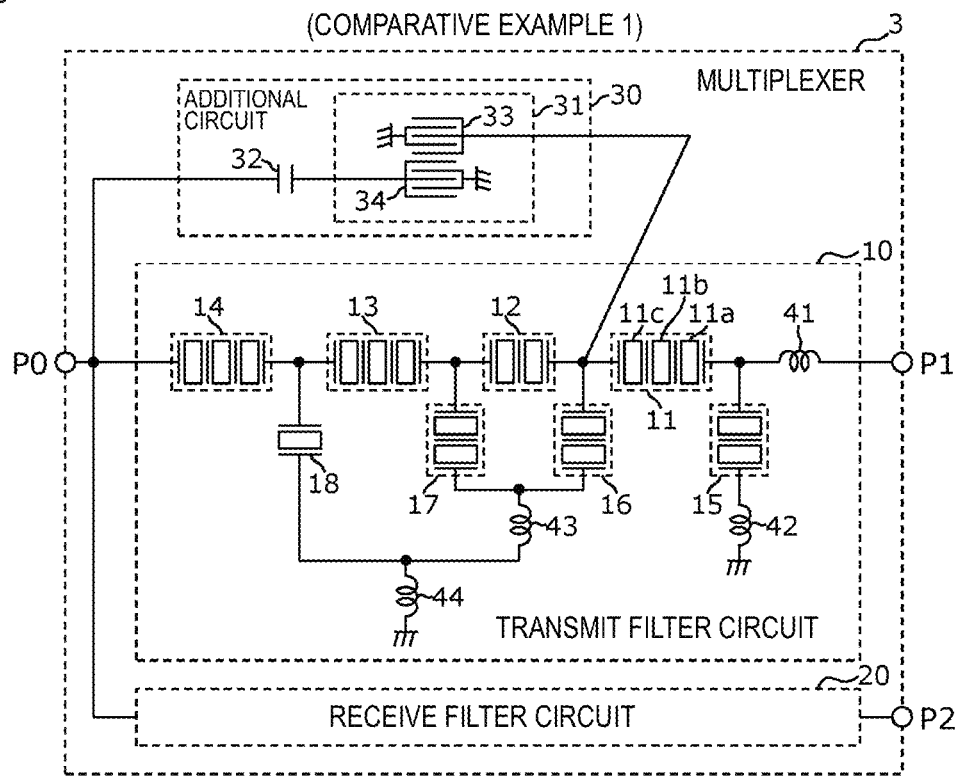
FIG. 3 is a circuit diagram illustrating an example of a multiplexer according to a Comparative Example 1.

FIG. 3 is a circuit diagram illustrating an example of a multiplexer according to a Comparative Example 1. In a multiplexer 3 illustrated in in FIG. 3, the resonator group 31 of the additional circuit 30 is connected to the signal path between the series resonators 11 and 12 of the transmit filter circuit 10.

Figure 4:
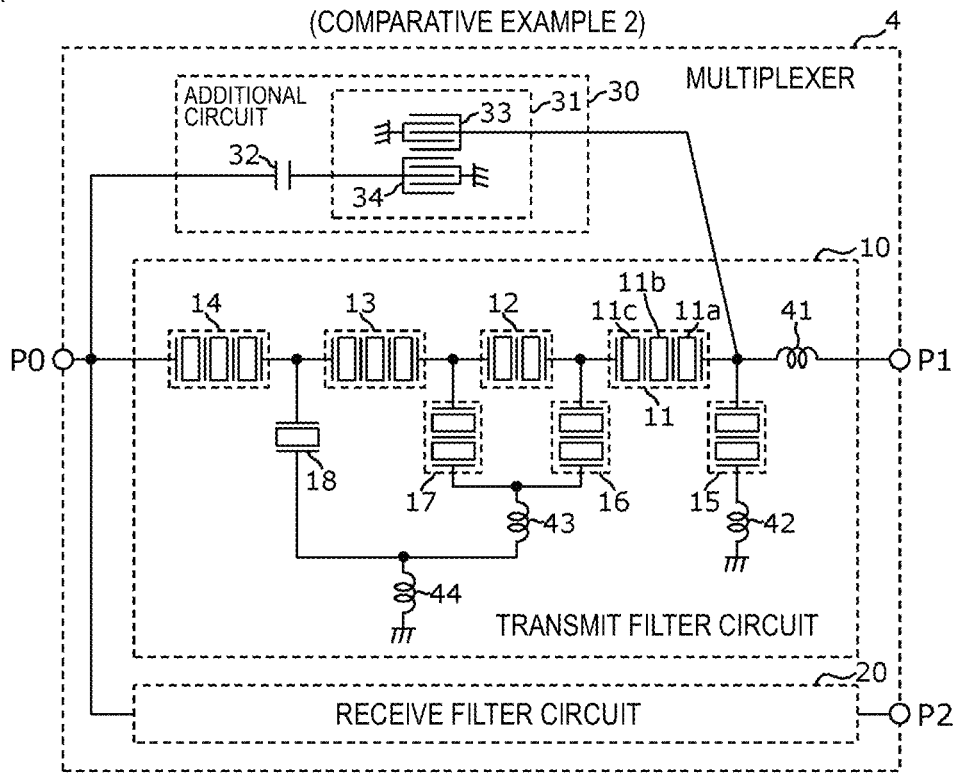
FIG. 4 is a circuit diagram illustrating an example of a multiplexer according to a Comparative Example 2.

FIG. 4 is a circuit diagram illustrating an example of a multiplexer according to a Comparative Example 2. In a multiplexer 4 illustrated in in FIG. 4, the resonator group 31 of the additional circuit 30 is connected to the signal path between an end portion of the series resonator 11 of the transmit filter circuit 10 near the terminal P1, and the inductor 41.

Figure 5:
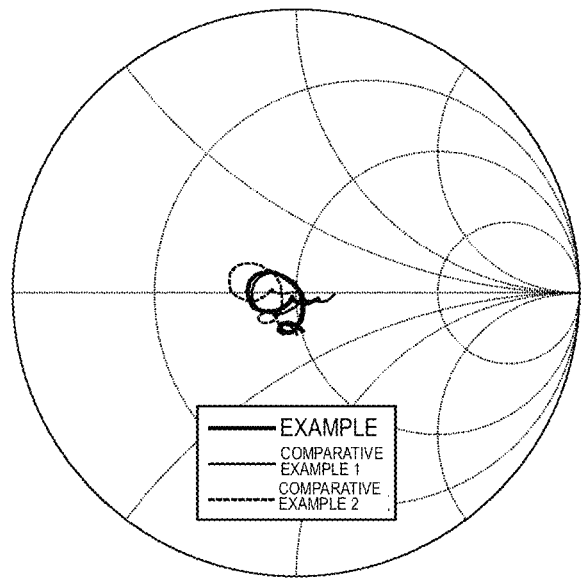
FIG. 5 is a Smith chart illustrating an example of the impedance of each multiplexer as seen from a terminal P1.

FIG. 5 is a Smith chart illustrating an example of the impedance of each multiplexer as seen from the terminal P1. In the example illustrated in FIG. 5, the characteristic impedance located at the center of the Smith chart is 50Ω.

Figure 6:
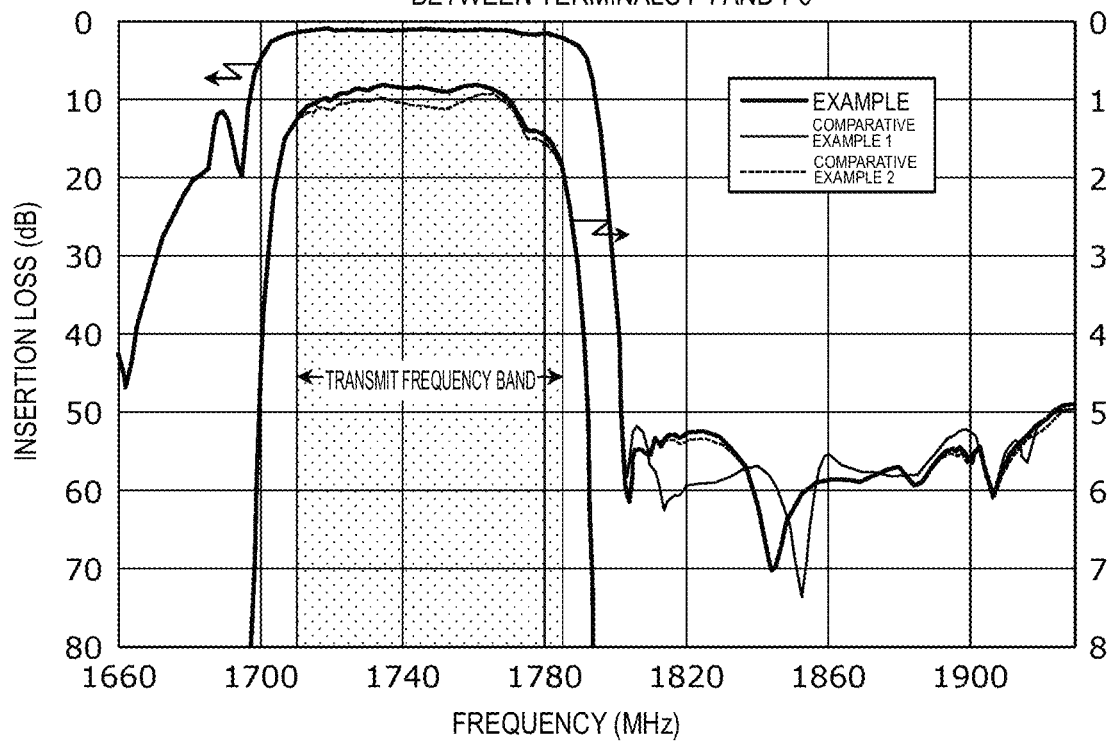
FIG. 6 is a graph illustrating an example of the bandpass characteristics between terminals P1 and P0 of each multiplexer.

FIG. 6 is a graph illustrating an example of the bandpass characteristics between the terminals P1 and P0 of each multiplexer. In FIG. 6, the bandpass characteristics in the transmit frequency band, in particular, are depicted in an enlarged fashion.

Figure 7:
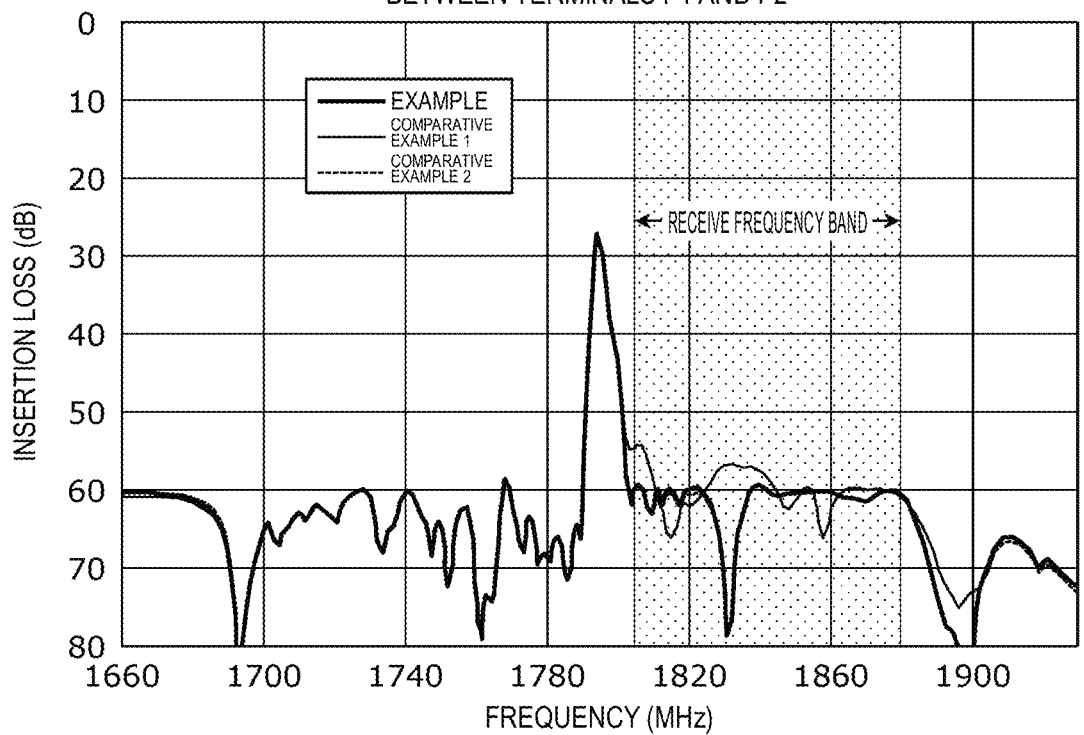
FIG. 7 is a graph illustrating an example of the isolation characteristics between terminals P1 and P2 of each multiplexer.

FIG. 7 is a graph illustrating an example of the isolation characteristics between the terminals P1 and P2 of each multiplexer.

As is apparent from FIG. 5, although the impedance of the multiplexer in the transmit frequency band as seen from the terminal P1 is well matched in the Example and Comparative Example 1, the impedance is shifted to the short-circuit side in Comparative Example 2. Further, as is apparent from FIG. 6, although the insertion loss between the terminals P1 and P0 in the transmit frequency band is substantially the same between the Example and Comparative Example 1, the insertion loss in Comparative Example 2 is greater (the enlarged portion in FIG. 6). This difference is attributed to the mismatch observed in FIG. 5.

As is apparent from FIG. 7, although the minimum value of insertion loss between the terminals P1 and P2 in the receive frequency band is substantially the same between the Example and Comparative Example 2, the minimum value of insertion loss is smaller in Comparative Example 1 (at the lower end of the receive frequency band). In other words, it is understood that in comparison with the Example and Comparative Example 2, Comparative Example 1 provides poor isolation between the terminals P1 and P2 with respect to a signal component in the receive frequency band. This difference results from the fact that in Comparative Example 1, the portion of the transmit filter circuit 10 connected in parallel with the additional circuit 30 is shorter than that in the Example and Comparative Example 2, which makes it more difficult to generate an effective cancellation signal.

As described above, the Example provides better attenuation between the terminals P1 and P0 in the transmit frequency band than Comparative Example 2, and also provides better isolation between the terminals P1 and P2 in the receive frequency band than Comparative Example 1. In other words, the Example provides more favorable electrical characteristics than Comparative Examples 1 and 2.

It is understood from the above results that the multiplexer 1 according to the Example makes it possible to achieve both reduced size and improved electrical characteristics.

In the multiplexer 1, the resonator group 31 of the additional circuit 30 is connected to the signal path between the split resonators 11a and 11b of the transmit filter circuit 10. However, this is not intended to be limiting.

Figure 8:
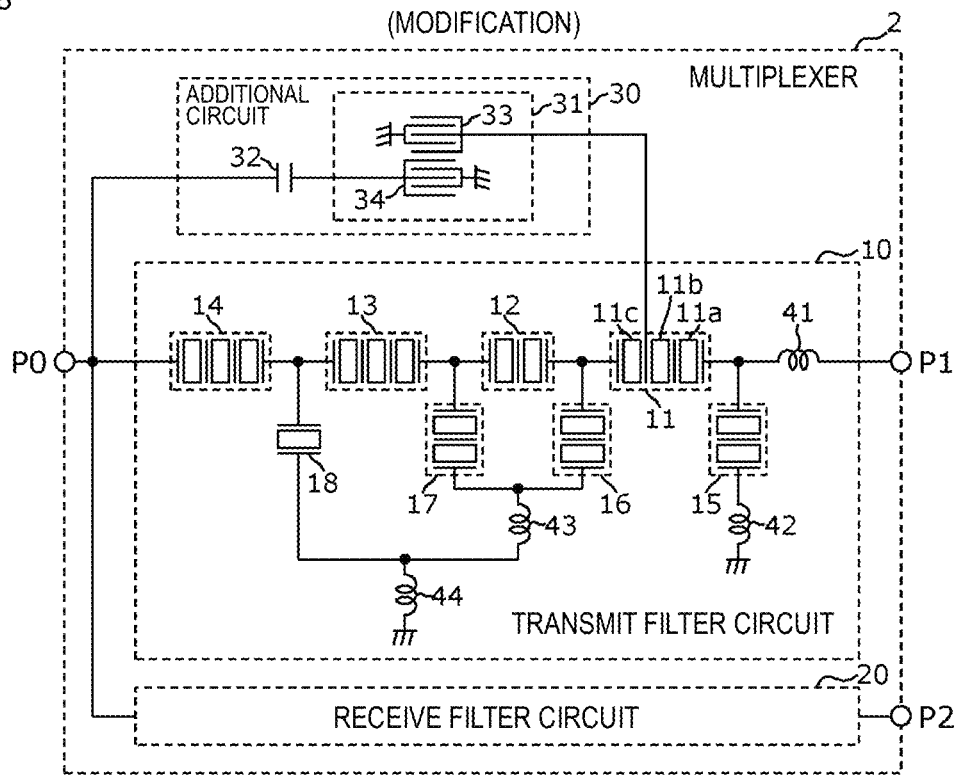
FIG. 8 is a circuit diagram illustrating an example of a multiplexer according to a modification of a preferred embodiment of the present invention.

FIG. 8 is a circuit diagram illustrating an example of a multiplexer according to a modification of a preferred embodiment of the present invention. In a multiplexer 2 illustrated in FIG. 8, the resonator group 31 of the additional circuit 30 is connected to the signal path between the split resonators 11b and 11c of the transmit filter circuit 10. With the multiplexer 2 as well, the same or similar advantageous effects as those of the multiplexer 1 can be obtained.

The configuration of the multiplexer 2 represents an example in which, if the series resonator closest to the first terminal of the first filter circuit includes three or more split resonators, the resonator group of the additional circuit is connected to the signal path between two of the split resonators excluding the split resonator closest to the first terminal.

With this configuration, the resonator group of the additional circuit is connected to the first terminal with two or more split resonators (the split resonators 11a and 11b in the case of the multiplexer 2) interposed therebetween.

At this time, at least two of the split resonators located between the resonator group and the first terminal may differ from each other in at least one of their capacitance and their surface area over the piezoelectric substrate.

More specifically, in the case of the multiplexer 2, the split resonators 11a and 11b may differ from each other in at least one of their capacitance and their surface area over the piezoelectric substrate. This makes it possible to design the split resonators 11a and 11b in accordance with their intended function, thus facilitating the design of the split resonators.

For example, the split resonator closest to the first terminal, that is, the split resonator 11a may be designed with a large capacitance or a large surface area to reduce current density so as to ensure sufficiently high electric power handling capability and sufficiently low distortion. Further, the split resonator 11b may be designed with a capacitance suited to provide matching of the multiplexer 2 as seen from the terminal P1.

Although multiplexers according to preferred embodiments of the present invention have been described above, the present invention is not limited to the individual preferred embodiments described above. It is to be noted that various modifications to the preferred embodiments as may be apparent to those skilled in the art, and combinations of features or components from different preferred embodiments may fall within preferred embodiments of the present invention.

For example, although a duplexer has been described as an example in the preferred embodiments above, applications of the present invention are not limited to a duplexer. For example, the present invention may be applied to a diplexer, a triplexer, a quadplexer, or other suitable multiplexer that separates and combines a plurality of signals in different frequency bands.

Preferred embodiments of the present invention can be used as a multiplexer with an additional circuit, in a wide variety of communication devices such as mobile phones, for example.

With the multiplexer configured as described above, the resonator group of the additional circuit is connected to the signal path between adjacent split resonators of a plurality of split resonators defining the series resonator closest to the first terminal of the first filter circuit. The additional circuit is thus connected to the first terminal with at least one split resonator of the first filter circuit interposed therebetween.

As a result, the combined impedance of the first filter circuit and the additional circuit as seen from the first terminal can be adjusted by the at least one split resonator of the first filter circuit. This eliminates the need to provide a capacitor at a location in the additional circuit near the first terminal, thus leading to reduced size of the multiplexer.

Further, as compared with a configuration in which the resonator group of the additional circuit is connected to the signal path between the series resonator closest to the first terminal of the first filter circuit, and the series resonator that is next closest to the first terminal, the above-described configuration increases the length of a portion of the first filter circuit connected in parallel with the additional circuit. This makes it easier to generate an effective cancellation signal, thus making it possible to more effectively improve electrical characteristics.

The configurations described above provide multiplexers that each makes it possible to achieve both reduced size and improved electrical characteristics.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   a first filter circuit connected to a common terminal and to a first terminal;
   a second filter circuit connected to the common terminal and to a second terminal; and
   an additional circuit connected in parallel with a portion of the first filter circuit; wherein the first filter circuit includes:
   at least one series resonator disposed on a signal path connecting the common terminal and the first terminal; and
   at least one parallel resonator disposed between ground and a corresponding node on the signal path;
   a series resonator of the at least one series resonator that is closest to the first terminal includes a plurality of split resonators connected in series such that no nodes are interposed between the plurality of split resonators;
   the additional circuit includes:

a resonator group including a plurality of interdigital transducer electrodes positioned side by side over a piezoelectric substrate in a direction of acoustic wave propagation; and a capacitor; and a first end of the resonator group is connected to the common terminal with the capacitor interposed between the first end of the resonator group and the common terminal, and a second end of the resonator group is connected to the signal path between adjacent split resonators of the plurality of split resonators such that no capacitor is interposed between the second end of the resonator group and the signal path.

2. The multiplexer according to claim 1, wherein the plurality of split resonators of the series resonator closest to the first terminal include three or more split resonators; and the second end of the resonator group is connected to the signal path between two of the three or more split resonators excluding a split resonator of the three or more split resonators that is closest to the first terminal.

3. The multiplexer according to claim 2, wherein the three or more split resonators include two or more split resonators located between the second end of the resonator group and the first terminal, and at least two of the two or more split resonators differ from each other in at least one of capacitance and surface area over the piezoelectric substrate.

4. The multiplexer according to claim 3, wherein of the two or more split resonators located between the other end of the resonator group and the first terminal, the split resonator closest to the first terminal is greatest in at least one of the capacitance and the surface area over the piezoelectric substrate.

5. The multiplexer according to claim 1, wherein the multiplexer is a duplexer.

6. The multiplexer according to claim 1, wherein the first filter circuit is a transmit filter circuit; and the second filter circuit is a receive filter circuit.

7. The multiplexer according to claim 1, wherein the common terminal is connected to an antenna.

8. The multiplexer according to claim 1, wherein the at least one series resonator and the at least one parallel resonator of the first filter circuit define a ladder resonator filter.

9. The multiplexer according to claim 1, wherein the second filter circuit includes a ladder filter circuit and a longitudinally coupled resonator filter circuit.

10. The multiplexer according to claim 1, wherein the first filter circuit includes an inductor disposed between the at least one series resonator and the first terminal.

11. The multiplexer according to claim 1, wherein the first filter circuit includes an inductor disposed between the at least one parallel resonator and ground.

12. The multiplexer according to claim 1, wherein the resonator group defines a longitudinally coupled resonator filter.

13. The multiplexer according to claim 1, wherein the resonator group defines a transversal filter.

14. The multiplexer according to claim 1, wherein the piezoelectric substrate is defined by a piezoelectric layer including lithium tantalate or lithium niobate.

15. The multiplexer according to claim 1, wherein each of the plurality of interdigital transducer electrodes includes an electrode layer made of copper or aluminum.

16. The multiplexer according to claim 15, wherein the electrode layer is coated with a protective layer.

* * * * *